United States Patent
Hatta et al.

[11] Patent Number: 5,998,337
[45] Date of Patent: *Dec. 7, 1999

[54] SUPERCONDUCTOR

[75] Inventors: Shinichiro Hatta, Hirakata; Hidetaka Higashino, Matsubara; Kumiko Hirochi, Moriguchi; Hideaki Adachi, Neyagawa, all of Japan

[73] Assignee: Matsushita Electric Industrial Co., Ltd., Osaka, Japan

[*] Notice: This patent is subject to a terminal disclaimer.

[21] Appl. No.: 09/188,232

[22] Filed: Nov. 9, 1998

Related U.S. Application Data

[63] Continuation of application No. 08/783,324, Jan. 15, 1997, abandoned, which is a continuation of application No. 08/543,045, Oct. 13, 1995, abandoned, which is a continuation of application No. 07/223,016, Jul. 22, 1988, Pat. No. 5,661,112.

[30] Foreign Application Priority Data

| Jul. 24, 1987 | [JP] | Japan | 62-186153 |
| Jul. 24, 1987 | [JP] | Japan | 62-186154 |
| Jul. 29, 1987 | [JP] | Japan | 62-189279 |
| Jul. 29, 1987 | [JP] | Japan | 62-189280 |

[51] Int. Cl.$^6$ .................................................. H01L 39/00
[52] U.S. Cl. ..................... 505/236; 505/237; 505/239; 505/701; 505/704; 428/336; 428/469; 428/701; 428/702; 428/930
[58] Field of Search ..................... 505/236, 237, 505/238, 239, 701, 702, 703, 704; 428/688, 689, 701, 702, 457, 469, 930, 336

[56] References Cited

U.S. PATENT DOCUMENTS

| 4,826,808 | 5/1989 | Yurek et al. . |
| 4,880,770 | 11/1989 | Mir et al. .................................. 505/325 |
| 4,952,554 | 8/1990 | Jin et al. . |
| 4,975,413 | 12/1990 | Satek et al. . |
| 5,002,928 | 3/1991 | Fukui et al. .............................. 505/401 |
| 5,017,551 | 5/1991 | Agostinelli et al. ..................... 505/235 |
| 5,122,507 | 6/1992 | Yamamoto et al. . |
| 5,168,127 | 12/1992 | Kohno et al. .......................... 174/125.1 |
| 5,661,112 | 8/1997 | Hatta et al. .............................. 505/237 |

FOREIGN PATENT DOCUMENTS

| 0284489 | 9/1988 | European Pat. Off. . |
| 0300499 | 1/1989 | European Pat. Off. . |

OTHER PUBLICATIONS

Interface Formation, Y. Gao et al., Amer. Inst. Physics, Conf. Proc. No. 165, Anaheim, CA, 1987.
Hammond et al., Superconducting Thin Films of Perovskite Superconductors by Electron Beam Deposition, Ext. Abstracts, High Tc Superconductors, pp. 169–171, Apr. 1987.
Spectroscopic Evidence, Meyer et al., Appl. Phys. Letts, 51(14), Oct. 1987.
Thermal Spraying, Kirkland et al., Advanced Ceramic Matls., vol. 2, No. 3B, Spec. Iss, 1987.
High Temperature Superconducting Thin Films, Singh et al., AIP, 1988, pp. 211–220, Nov. 1987.
Use of High Temperature Superconductors, Biegel et al., Met. Res. Soc. Symp. Proc., vol. 99, Dec. 1987.

(List continued on next page.)

*Primary Examiner*—Marie Yamnitzky
*Attorney, Agent, or Firm*—Stevens, Davis, Miller & Mosher, L.L.P.

[57] ABSTRACT

Excellent films of a high Tc superconductor are easily produced on metal coated substrates at a temperature below 700° C. These metal buffer films are made of Pt, Au, Ag, Pd, Ni or Ti. The film superconductivity is significantly improved by the metal buffer layer. Since it is easy to form this metal coating on a substrate, the invention can increase the potential number of usable substrates such as fibers, amorphous solids or semiconductors.

13 Claims, 3 Drawing Sheets

OTHER PUBLICATIONS

The Application of SC Ceramics as Substrates, Jap. Journ. Appl. Phys., vol. 26, No. 11, pp. L1842–L1844, Nov. 1987.

Hackh's Chemical Dictionary, 5th ed., pp. 27, 518, 1993.

Sahu et al., in Chemical of High Tc Superconductors II, Chapter 1, 1988.

*Japanese Journal of Applied Physics*, vol. 27, No. 2, Feb. 1988, pp. L209–L210, Hiroshi Maeda et al., "A New High–$T_c$ Oxide Superconductor without a Rare Earth element".

*Nature*, vol. 332, Mar. 10, 1988, pp. 138–141, Z.Z. Sheng & A.M. Hermann, "Bulk superconductivity at 120 K in the Tl–Ca/Ba–Cu–O system".

Ferroelectrics, vol. 63, Nos. 1–4, 1985, pp. 227–234, New York, US; T. Shiosaki et al: "Properties of Sputter–Deposited PbT103, Pb(Zr,T1)03,Pb2KNb5015 Films", Abstract, pp. 229–231.

Applied Physics Letters, vol. 53, No. 2, Jul. 11, 1988, pp. 148–150, New York, US; S. Hatta et al.: "Pt–Coated Substrate Effect on Oxide Superconductive Films in Low–Temperature Processing", p. 148.

Applied Physics Letters, vol. 51, No. 25, Dec. 21, 1987, pp. 2155–2157 New York, US; C.L. Chien et al.: "Effect of noble metal buffer layers on superconducting YBa2Cu307 thin films".

SUPERCONDUCTOR

CROSS-REFERENCE TO RELATED APPLICATIONS

This application is a continuation of application Ser. No. 08/783,324, filed Jan. 15, 1997, now abandoned which, in turn, is a continuation of application Ser. No. 08/543,045, filed Oct. 13, 1995, now abandoned, which, in turn, is a continuation of application Ser. No. 07/223,016, filed Jul. 22, 1988, now U.S. Pat. No. 5,661,112.

BACKGROUND OF THE INVENTION

This invention relates to a superconductor, more particularly, to a compound film superconductor.

A-15 type binary (two-element) compounds such as niobium nitride (NbN) and niobium germanide ($Nb_3Ge$) had been known as high Tc superconductors, but the superconducting transition temperature of these materials was only about 24° K at highest. Perovskite type ternary (three-element) compounds have been expected to show higher transition temperatures, and a Ba—La—Cu—O high-Tc-superconductor has been proposed (J. B. Bendorz and K. A. Muller, Zetschrift für Physik B—Condensed Matter, 64, 189–193, 1986).

Recently it was reported that Y—Ba—Cu—O type compounds could form superconductors with even higher transition temperatures than those of prior Ones (M. K. Wu et al, Physical Review Letters, Vol. 58, No. 9, 908–910, 1987).

The superconducting mechanism of the Y—Ba—Cu—O type materials is not yet definitely known, but there is a possibility that these materials could have respectively transition temperatures higher than the temperature of liquid nitrogen and it is expected that such compounds would show more useful properties than the conventional binary compounds as high-Tc-superconductors.

More recently, as superconductive materials with higher transition temperatures, Bi—Si—Ca—Cu—O system (H. Maeda et al, Japanese Journal of Applied Physics, 27, 1988, L209) and Tl—Ba—Ca—Cu—O systems (Z. Z. Sheng et al, Nature, 332, 1988, L139) have been discovered, both of which have transition temperatures higher than 120 K.

However, with the present technical level, these oxide superconductive materials can only be produced by a sintering process, so that these superconductive materials are available only in the form of powders or blocks of ceramics. In the practical applications of these types of materials, it is strongly desired that they are made into a film or wire. It has been, however, very difficult with the conventional technique to obtain a desired film or wire from these materials because of the poor reproducibility and a lack of reliability of their superconductive properties when they are made into a film or wire.

The present inventors found that it is possible to form from these materials a high Tc superconductor film retaining well the characteristics of these materials by using film producing techniques such as sputtering etc. and adding a novel concept to the interface structure of the superconductor film. Based on this finding and by further incorporating unique ideas in the film substrate, the present inventors have succeeded in creating a novel superconducting film structure

SUMMARY OF THE INVENTION

The superconductor according to this invention comprises an oxide film deposited on a metal film formed on a substrate, these oxide containing A, B and Cu and being a ternary (three-element) or quaternary (four-element) compound having an elemental ratio satisfying the following relation:

$$0.5 \leq \frac{A+B}{Cu} \leq 2.5$$

wherein A is at least one element selected from Tl, Bi, Sc, Y and lanthanum series elements (atomic number: 57–71), and B is at least one elements selected from Ba, Sr, Ca, Be, Mg and Group IIa elements.

The superconductor of this invention is essentially characterized in that a superconductive film is formed on a metal buffer film. The superconductive film is produced from the sputtering target which is made by breaking down its bare material into very fine powder and depositing such powdery target on a substrate, so that the composition of the formed superconductor film is essentially homogeneous as compared with the conventional sintered materials. Also, the superconductive film is homogeneously deposited and it becomes dense and flat on a metal film. Therefore, the present invention can not only realize an extraordinarily high quality superconductor but also increase the potential number of usable substrates, making it possible to obtain a film structure suitable for realizing various types of superconductor devices using super-conductive films.

DETAILED DESCRIPTION OF THE INVENTION

Figure 1:
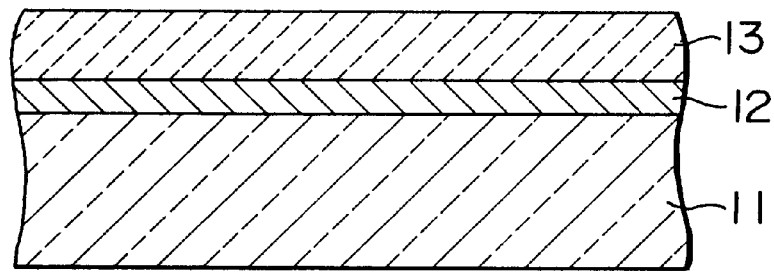
FIG. 1 is a sectional view showing the structure of a substrate for a superconductor as an embodiment of this invention.
Figure 3:
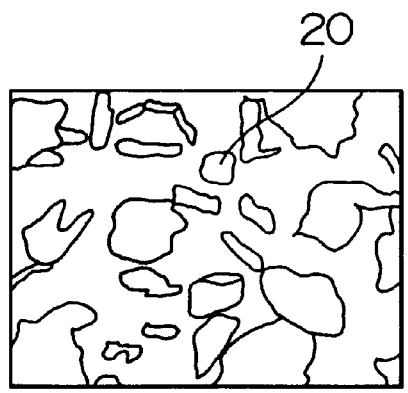
FIG. 3 is a similar view to FIG. 1 of the superconductor surface when no Pt film was deposited.

Referring to FIG. 1, a ternary or quarternary compound film 13 is deposited, by sputtering for instance, on a metal film 12 formed on the surface of a substrate 11. Substrate 11 is designed to hold the superconductive compound film 13. This compound film 13 is formed usually at a high temperature on the order of 700° C. When a ternary compound film was formed directly on substrate 11 with no buffer layer of metal film 12, the superconductive film gave a surface morphology shown in FIG. 3, that is, it became a microcrystalline plate 20 and was in a state of being directed randomly. This film was small in superconducting critical current, high in hygroscopicity because of high vacancy rate, poor in reliability, with a roughened surface and incapable of micro-fabrication such as photoetching.

Figure 2:
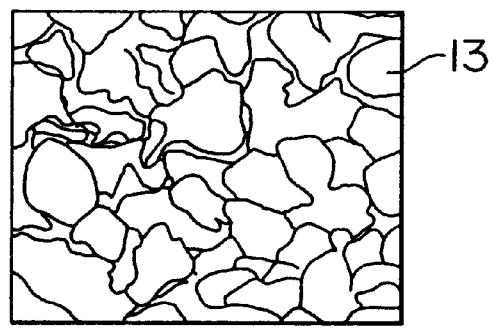
FIG. 2 is a view showing the surface morphology of this superconductor as observed by SEM photography (10,000 magnifications).
Figure 6:
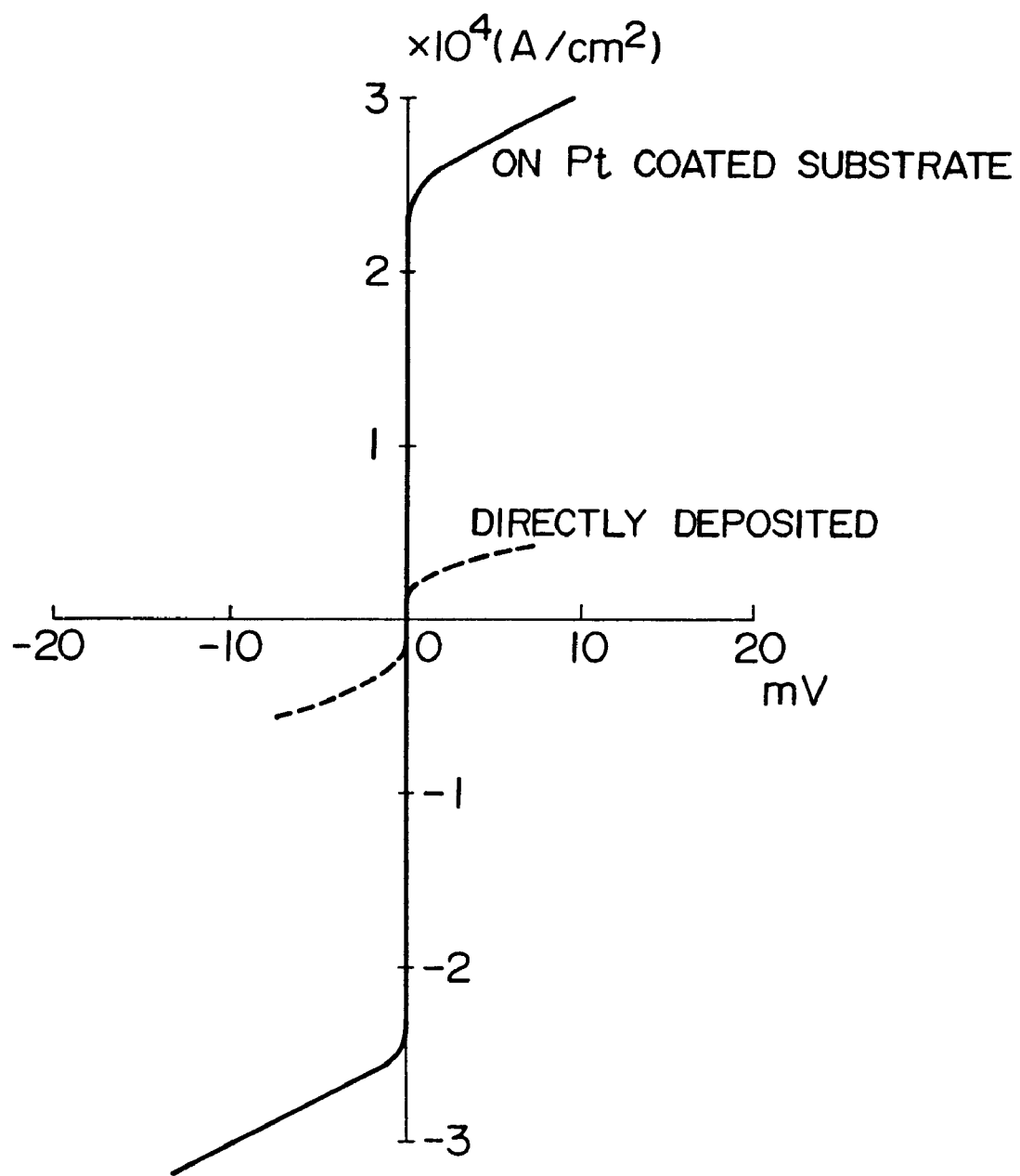
FIG. 6 is a graph showing comparatively the current density in a film formed directly on a sapphire substrate and that in a film formed on a Pt-coated substrate.

When the metal film 12 was formed at the interface between substrate 11 and a film 13 of a ternary compound such as YBaCuO, there was obtained a smooth surface state as illustrated in FIG. 2. As noted from the surface morphology, the film 13 was in a dense state in its morphology and the critical current density was improved approximately 10 times over the film of FIG. 3. The results are represented graphically in FIG. 6. The present inventors have also confirmed the enhancement of zero-resistance temperature from 73 K to 88 K and a significant improvement of film quality. Thus, the intervention of metal film 12 has produced a remarkable effect for the improvement of various superconductive properties, too.

As a result of studies on the materials of metal film 12 shown in FIG. 1, the present inventors found that Ni, Pd, Pt, Au, Ag and Ti mere effective, Pt being the best choice. The similar effect was seen in use of quaternary compounds such as BiSrCaCuO and TlBaCaCuO. However, no desired film could be formed on a Mo, Ta or Cu surface.

Figure 4:
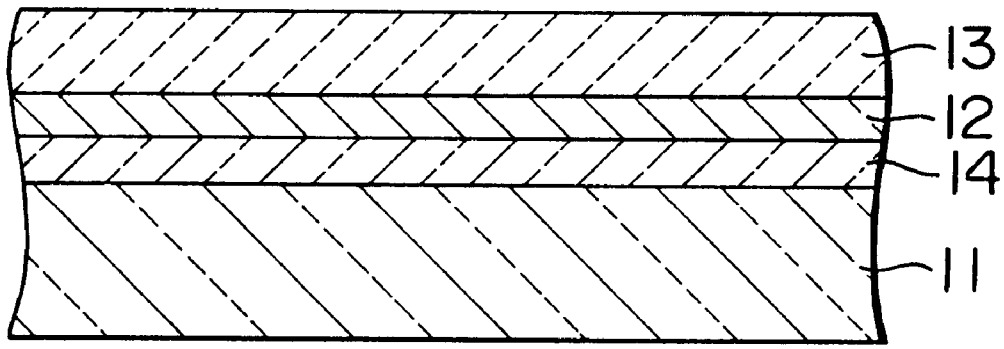
FIG. 4 is a sectional view of a superconductor on a glass-coated substrate.

Among the substrates mentioned above, there are some on which it is difficult to form a metal film by said sputtering. In such a case, a glass coating 14 is first formed on substrate 11 and then a metal film 12 is formed thereon, followed by deposition thereon of a superconductive oxide film at a high temperature of about 700° C. as shown in FIG. 4. Quartz glass, high silica glass, borosilica glass, soda-lime glass and oxynitride glass could be effectively used for such glass coating.

The present inventors also found that certain materials could be advantageously used for the substrate 11 of FIG. 1 for obtaining its best performance.

A single crystal substrate is effective for forming a highly crystalline ternary or quaternary oxide compound film 13 on the surface of metal film 12 provided on substrate 11. As a result of research on substrate materials effective for forming a superconductor comprising a ternary oxide compound film, the present inventors confirmed that single crystals of magnesium oxide (MgO), sapphire ($\alpha$-$Al_2O_3$), spinel, strontium titanate ($SrTiO_3$), silicon (Si), silicon compounds, gallium arsenide etc. are effective as substrate material. This was quite a surprising revelation. The thickness of metal film 12 is usually in the range of tens to thousands of angstroms (Å), so that it is inconceivable from conventional knowledge that the ternary compound film should be influenced by the crystallinity of the substrate there-below.

The crystalline structure and chemical composition of the A—B—Cu—O superconductor of this invention are not yet definitely known, but the analyses show that it has an oxygen-defected perovskite structure. The present inventors confirmed that when the elemental ratio in the produced film is in the range defined by $$0.5 \leq \frac{A+B}{Cu} \leq 5.0,$$

a superconducting phenomenon is observed in the film though there could be slight differences in transition temperature.

In sputtering deposition, a sintered A—B—Cu—O ceramic is used as target, but in case the substrate temperature is 700° C., there is seen a tendency that the produced film becomes deficient in Cu as compared with the metal components of the target. The present inventors confirmed, however, that this can be overcome by adding about 50% excess amount of Cu in the target. From the above, it was determined that the target composition should be the one defined by $$0.3 \leq \frac{A+B}{Cu} \leq 1.7$$

which falls in the optimal compositional range of the film. If the target composition is in this range, desired sputtering deposition can be accomplished not only when the target is a plate-like, cylindrical or fiber-like ceramic but also when it is in the form of sintered particles or powders. In the case where the target-is in a powdery form, the powder is placed in, for instance, a stainless steel dish. In case of using a fiber-like substrate, it is effective to employ glass fiber, carbon fiber or heat-resistant alloy fibers comprising niobium, titanium, tantalum, stainless steel, etc.

The present inventors confirmed that when fabricating this type of superconductor in a desired form, for example, in a cylindrical form, it is more effective to use as metal-coated substrate so-called sintered chinaware than single crystals, and they also found the most suitable chinaware materials. That is, the present inventors confirmed that alumina, magnesia, zirconia, steatite, forsterite, beryllia, spinel and the like are best suited for use as metal-coated chinaware substrate these materials are excellent in workability and fitness to the substrate 11 of the superconductive film 12. In this case, it suffices if at least the surface of the substate is composed of said chinaware material as in the case of single crystals.

As a result of more close examinations on effectiveness of these crystalline substrates, the present inventors found that there is a preferred direction for crystalline orientation of this type of crystalline substrate. It was discovered that in case of using single crystals of sapphire as substrate, it is possible to integrate the superconductive film of this invention in a silicon device of an SOS (silicon on sapphire) structure by heteroepitaxially growing a (100) Si film on the R plane. The present inventors also confirmed that in the case of C plane and a plane sapphire, the integration with an SOS silicone devices is possible by heteroepitaxially growing a (111) Si film on the planes.

It was further confirmed by the present inventors that in the case of a C plane sapphire single substrate, it is possible to integrate a superconductor of a laminar structure of this invention with a Groap III-V semiconductor device by heteroepitaxially growing a Group III-V semiconductor film such as a (111) GaAs film, (001) GaN film, (111) GaP film, etc., on said substrate. This indicates the practical applicability of the superconductor of this invention for wiring of ultra-high-speed GaAs devices. The present inventors also confirmed that in the case of spinel single crystal substate, it is possible to integrate the superconductor of this invention with an Si or GaAs device in the same way as in the case of sapphire single crystal substrate by heteroepitaxially growing a (100) Si film or (111) GaAs film on the substrate surface by using the (100) plane spinel.

It was further ascertained that in the case of using a (110) plane spinel substrate, integration with an Si or GaAs device is possible by effecting heteroepitaxial growth of a (110) Si film or (100) GaAs film on the substrate surface. The present inventors also disclosed that in the case of $SrTiO_3$ single crystal substrate, the grown superconductor film is provided with very excellent crystallinity when the (100) plane is used as substrate.

Then, a superconductor film was formed on an amorphous solid by using the buffer metal film.

Figure 5:
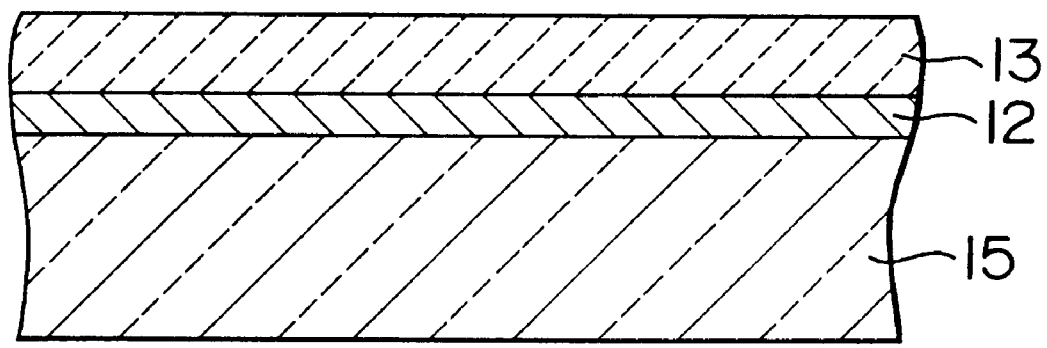
FIG. 5 is a sectional view showing the structure of a superconductor on an amorphous substrate.

Referring to FIG. 5, a compound film 13 is deposited, by sputtering for instance, on a metal film 12 formed on the surface of an amorphous substrate 15. In this case, substrate 15 serves for holding the superconductive compound film 13. This film 13 is usually deposited at a high temperature of 700° C. When the compound film was deposited directly on the amorphous substrate 15 with no intervention of metal film 12, the strong adhesion to the substrate was lost and electric resistance increased excessively to destroy the superconductive properties. When metal film 12 was interposed between substrate 15 and three-element compound film, the surface assumed a dense state as shown in FIG. 2 and a good superconductive film 13 was obtained.

The present inventors also found that amorphous substances such as quartz glass, pyrex, amorphous silicon, etc., are effective for the substrate 15 of FIG. 5.

For better understanding of the subject matter of this invention, it will be described more concretely below by showing the embodiments.

EMBODIMENTS

By using sapphire single crystal R plane as substrate 11 and a Pt plate as target, a Pt film 12 was deposited on the substrate by DC planer magnetron sputtering as shown in FIG. 1. Deposition was carried out at a sputtering power of 300 V×30 mA by using Ar gas pressurized to 8 Pa and maintaining the substrate temperature at 250–500° C. to form a 0.1 $\mu$m thick film. This Pt film was polycrystalline. On this Pt film 12 was deposited a compound film 13 by high frequency planer magnetron sputtering using sintered $ErBa_2Cu_{4.5}O_8$ as target. This sputtering deposition of compound film 13 was carried out under Ar gas pressure of 0.5 Pa at a sputtering power of 150 W for a period of one hour by maintaining the substrate temperature at 700° C. to form a 0.5 $\mu$m thick film.

This film showed a room-temperature resistance of 600 Ω and a superconducting transition temperature of 88 K.

Film formation on a glass coated substrate is described below with reference to FIG. 4.

Used as substrate 11 was the silicon single crystal (111) plane coated with heat-oxidized silicon to form a 1,000 Å thick glass coating 14. By using a Pt plate as target, a Pt film 12 was deposited on said glass coating 14 by DC planer magnetron sputtering under the following conditions: Ar gas pressure: 8 Pa, sputtering power: 300 V×30 mA, substrate temperature: 250–500° C., film thickness: 0.1 $\mu$m. This Pt film had a polycrystal structure. On this Pt film 12 was deposited a three-element compound superconductive film 13 by high-frequency planer magnetron sputtering using a sintered $ErBa_2Cu_{4.5}O_5$ target. This deposition was carried out under an Ar gas pressure of 0.5 Pa at a sputtering power of 150 W for a period of one hour by maintaining the substrate temperature at 700° C. to form a 0.5 $\mu$m thick film. The thus formed superconductive film showed a room-temperature resistance of 600 Ω and a superconducting transition temperature of 88 K.

Described below is another embodiment of the invention in which a superconductive film was formed on an amorphous substrate.

As shown in FIG. 5, a Pt film 12 was deposited on a quartz glass substrate 15 by DC planer magnetron sputtering using a Pt plate target. Sputtering was carried out in an 8 Pa argon gas at a sputtering power of 300 V×30 mA by maintaining the substrate temperature at 250–600° C. to form a 0.1 $\mu$m thick film. This Pt film was polycrystalline. On this Pt film was deposited a compound film 13 by high-frequency planer magnetron sputtering with a sintered $ErBa_2Cu_{4.5}O_8$ target under the following conditions: Ar gas pressure: 0.5 Pa, sputtering power: 150 W, sputtering time: 2 hours, substrate temperature: 700° C., film thickness: 0.5 $\mu$m.

The thus obtained superconductive film showed a room-temperature resistance of 30 Ω and a superconducting transition temperature of 90 K.

As described above, the superconductor according to this invention is characterized in that a superconductive compound film is formed on a metal film. The superconductive compound film is formed by first breaking down the base superconductive material into a state of very fine particles, which is called "atomic state", and depositing such particulate material on a substrate, so that the composition of the formed superconductor is essentially homogeneous as compared with the conventional sintered products. Thus, a superconductor of extraordinarily high quality is realized by the present invention.

According to the present invention, as explained above, it is possible to form a superconductive film which is dense in its entire structure and also improved in critical current density. Further, the superconductive film of this invention can be integrated with various electronic devices such as Si and GaAs devices and is also applicable as a key material for various types of superconductive devices such as Josephson elements. It is to be noted particularly that there is a possibility that the transition temperature of this type of compound superconductors could be reduced to room temperature. This invention, therefore, can expand the scope of use of superconductors and thus is of high industrial value.

The present invention can increase the types of substrate usable for superconductors by incorporating a metal film and makes it possible to form on such substrates a high quality superconductive film having a high critical temperature and a high critical current density. Thus, this invention greatly contributes to the realization of various types of superconductive devices.

What is claimed is:

1. A superconductive film comprising an A—B—Cu oxide film, a metal film and a substrate, the A—B—Cu oxide film being deposited on the metal film formed on the substrate, said A—B—Cu oxide containing elements A and B and Cu and O, the molar ratio of said elements A and B and Cu being in a range of $$0.5 \leq \frac{A+B}{Cu} \leq 2.5$$

wherein the element A is one element selected from Tl, Bi, Pb, Sc, Y and lanthanum series elements atomic number: 57–71, and the element B is one element selected from the Group IIa elements; the said metal film being a transition metal element selected from the group consisting of Pt, Pd and Ni, the composition A—B—Cu—O of said oxide film being in the form of a layered oxygen-defected perovskite structure, where in the oxide film is deposited on the metal film by a vacuum deposition, and wherein the metal film has a thickness of from about 10 angstroms to about 1000 angstroms.

2. A superconductive film according to claim 1, wherein the substrate is composed of at least one chinaware material selected from alumina, MgO, $ZrO_2$, steatite, forsterite, beryllium and spinel.

3. The superconductive film of claim 1, wherein the superconductive film is not subjected to a heat treatment after said oxide film is deposited on said metal film.

4. The superconductive film of claim 1, wherein element A is one element selected from Sc, Y and lanthanum.

5. The superconductive film of claim 1 wherein the oxide is one selected from the group consisting of La Ba Cu O; Bi Sr Ca Cu O; Tl Ba Ca Cu O; and Y Ba Cu O.

6. The superconductive film of claim 5 wherein the oxide is Y Ba Cu O.

7. The superconductive film according to claim 1, wherein at least one said metal film is formed on said oxide film to form a multi-layered structure.

8. A superconductive film according to claim 1, wherein at least one said metal film and at least one said oxide film are laminated alternately on said oxide film to form a multi-layer structure.

9. The superconductive film according to claim 8, using a single crystal R plan sapphire substrate.

10. The superconductive film according to claim 1, wherein said oxide film is deposited on the metal film by sputtering deposition.

11. The superconductive film of claim 1, wherein the substrate is a single crystal selected from the group consisting of magnesium oxide, sapphire, spinel, strontium titanate, silicon, silicon compounds, and gallium arsenide.

12. The superconductive film of claim 1, wherein said substrate is a member selected from the group consisting of glass fiber, carbon fiber, and chinaware material.

13. A planar laminate superconductor comprising an A—B—Cu oxide film deposited on a metal film formed on a substrate comprising a single crystal R plane sapphire substrate, said A—B—Cu oxide containing elements A and B and Cu and O, the molar ratios of said elements A and B and Cu being in a range of $$0.5 \leq \frac{A+B}{Cu} \leq 2.5$$

wherein the element A is one element from Tl, Bi, Pb, Sc, Y and lanthanum series elements atomic number: 57–71, and the element B is one element selected from the group IIa elements; the metal film being a transition metal element selected from the group consisting of Pt, Pd and Ni, the composition A—B—Cu—O of said oxide film being in the form of a layered oxygen-defective perovskite structure wherein the oxide film is deposited on the metal film by vacuum deposition, wherein at least one said metal film is formed on said oxide film to form a multi-layer structure.

* * * * *